US012626623B2

(12) United States Patent
Yang et al.

(10) Patent No.: US 12,626,623 B2
(45) Date of Patent: May 12, 2026

(54) CHIP-ON-FILM PACKAGE AND A DISPLAY DEVICE INCLUDING THE SAME

(71) Applicant: SAMSUNG ELECTRONICS CO., LTD., Suwon-si (KR)

(72) Inventors: Kyoungsuk Yang, Suwon-si (KR); Jinchul Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 139 days.

(21) Appl. No.: 18/382,110

(22) Filed: Oct. 20, 2023

(65) Prior Publication Data

US 2024/0274046 A1 Aug. 15, 2024

(30) Foreign Application Priority Data

Feb. 13, 2023 (KR) ........................ 10-2023-0018781

(51) Int. Cl.
*G09G 3/00* (2006.01)
*H10D 86/40* (2025.01)
*H10D 86/60* (2025.01)

(52) U.S. Cl.
CPC ........... *G09G 3/006* (2013.01); *H10D 86/443* (2025.01); *H10D 86/60* (2025.01); *G09G 2330/06* (2013.01)

(58) Field of Classification Search
CPC .. G09G 3/006; G09G 2330/06; H10D 86/443; H10D 86/60; H01L 23/49838;
(Continued)

(56) References Cited

U.S. PATENT DOCUMENTS

| | | | |
|---|---|---|---|
| 5,378,981 A * | 1/1995 | Higgins, III | ...... H01L 23/49572 324/750.05 |
| 6,559,549 B1 * | 5/2003 | Cho | .................... H01L 23/4985 257/E23.179 |

(Continued)

FOREIGN PATENT DOCUMENTS

| | | |
|---|---|---|
| JP | 2008-270276 A | 11/2008 |
| KR | 10-2009-0098657 A | 9/2009 |

(Continued)

OTHER PUBLICATIONS

Office Action dated Mar. 10, 2026 issued in corresponding to Korean Patent Application No. 10-2023-0018781.

*Primary Examiner* — Akm Zakaria
(74) *Attorney, Agent, or Firm* — Morgan, Lewis & Bockius LLP

(57) ABSTRACT
A chip-on-film package including: a base film; chip pads including a first signal pad, a second signal pad, first dummy pads, and second dummy pads, wherein the chip pads are connected to a semiconductor chip attached to the base film; and wiring patterns including a first signal pattern connected to the first signal pad, a second signal pattern connected to the second signal pad, a first dummy pattern connected to the first dummy pads, and a second dummy pattern connected to the second dummy pads, wherein the first dummy pads and the second dummy pads are continuously disposed in a first direction, the first dummy pattern is disposed between the first signal pattern and the second dummy pattern, and a distance between the first dummy pattern and the first signal pattern is greater than a distance between the first dummy pattern and the second dummy pattern.

19 Claims, 11 Drawing Sheets

(58) Field of Classification Search
CPC ..... H01L 22/32; H01L 23/4985; H01L 23/60; H01L 24/15; G02F 1/1345
See application file for complete search history.

(56) References Cited

U.S. PATENT DOCUMENTS

| | | | | |
|---|---|---|---|---|
| 7,238,962 | B2 | 7/2007 | Kim | |
| 8,228,677 | B2 * | 7/2012 | Kunimatsu | H05K 1/111 |
| | | | | 257/784 |
| 8,279,617 | B2 * | 10/2012 | Choi | H01L 24/06 |
| | | | | 361/767 |
| 8,680,524 | B2 | 3/2014 | Oh | |
| 8,709,832 | B2 | 4/2014 | Kim et al. | |
| 9,293,073 | B2 | 3/2016 | Chen | |
| 9,589,992 | B2 * | 3/2017 | Hwang | H10D 89/931 |
| 11,836,310 | B2 * | 12/2023 | Huang | G06F 3/044 |
| 2008/0251930 | A1 * | 10/2008 | Kobayashi | H01L 23/522 |
| | | | | 257/773 |
| 2017/0031191 | A1 * | 2/2017 | Choi | H01L 21/78 |
| 2018/0076229 | A1 | 3/2018 | Kwon et al. | |
| 2018/0342699 | A1 | 11/2018 | Son et al. | |
| 2022/0173026 | A1 | 6/2022 | Yang et al. | |

FOREIGN PATENT DOCUMENTS

| | | | |
|---|---|---|---|
| KR | 10-2011-0033328 A | 3/2011 | |
| KR | 10-2012-0073765 A | 7/2012 | |
| KR | 10-1908502 | 10/2018 | |

* cited by examiner

200

200

'A'

1

CHIP-ON-FILM PACKAGE AND A DISPLAY DEVICE INCLUDING THE SAME

CROSS-REFERENCE TO RELATED APPLICATION(S)

This application claims priority under 35 U.S.C. § 119 to Korean Patent Application No. 10-2023-0018781 filed on Feb. 13, 2023 in the Korean Intellectual Property Office, the disclosure of which is incorporated by reference herein in its entirety.

TECHNICAL FIELD

The present inventive concept relates to a chip-on-film package and a display device including the same.

DISCUSSION OF RELATED ART

Display devices include a display panel on which a plurality of pixels are disposed and a driving device for driving the plurality of pixels. The driving device may include at least one semiconductor chip. Semiconductor chips, which output signals to drive the pixels, may be mounted on a chip-on-film package and connected to a display panel. This package may include a plurality of wiring patterns. Additionally, the chip-on-film package may include at least one dummy pattern to be used in an electrostatic discharge (ESD) test to evaluate the impact of static electricity introduced by various factors.

SUMMARY

An embodiment of the present inventive concept provides a chip-on-film package where the distance between a dummy pattern, used for electrostatic discharge (ESD) testing, and a signal pattern connected to a display panel and used to transmit signals to a plurality of pixels is sufficiently secured. This design strengthens resistance to static electricity. Additionally, there is provided a display device including the same.

According to an embodiment of the present inventive concept, there is provided a chip-on-film package including: a base film; a plurality of chip pads including a first signal pad, a second signal pad, a plurality of first dummy pads, and a plurality of second dummy pads, wherein the plurality of chip pads is connected to a semiconductor chip attached to the base film; and a plurality of wiring patterns including a first signal pattern connected to the first signal pad, a second signal pattern connected to the second signal pad, a first dummy pattern connected to the plurality of first dummy pads, and a second dummy pattern connected to the plurality of second dummy pads, wherein the plurality of first dummy pads and the plurality of second dummy pads are continuously disposed in a first direction, the first dummy pattern is disposed between the first signal pattern and the second dummy pattern, and a distance between the first dummy pattern and the first signal pattern is greater than a distance between the first dummy pattern and the second dummy pattern.

According to an embodiment of the present inventive concept, there is provided a display device including: a display panel on which a plurality of pixels connected to a plurality of gate lines and a plurality of source lines are arranged; and a chip-on-film package including a base film attached to the display panel and a semiconductor chip mounted on the base film, wherein the chip-on-film package includes a plurality of chip pads connected to the semiconductor chip, a plurality of dummy patterns connected to dummy pads among the plurality of chip pads, a plurality of signal patterns connected to signal pads among the plurality of chip pads, and a plurality of test pads connected to the plurality of dummy patterns, and in a first direction at least one of the plurality of dummy patterns is adjacent to one of the plurality of signal patterns and separated therefrom by a first distance, and the first distance is greater than at least one of a second distance between a pair of dummy patterns adjacent to each other while extending in the first direction and a third distance between a pair of signal patterns adjacent to each other while extending in the first direction.

According to an embodiment of the present inventive concept, there is provided a chip-on-film package including: a base film; a first signal pad formed on the base film and connected to a first source line among a plurality of source lines disposed on a display panel through a first signal pattern; a second signal pad formed on the base film and connected to a second source line among the plurality of source lines through a second signal pattern; a first dummy pattern separated from the first signal pattern by a first distance and connected to a first test pad separated from the display panel; and a second dummy pattern separated from the first dummy pattern by a second distance, smaller than the first distance, and connected to a second test pad separated from the display panel.

BRIEF DESCRIPTION OF THE DRAWINGS

The above and other features of the present inventive concept will be more clearly understood from the following detailed description, taken in conjunction with the accompanying drawings, in which.

DETAILED DESCRIPTION OF THE EMBODIMENTS

Hereinafter, example embodiments of the present inventive concept will be described with reference to the accompanying drawings.

Figure 1:
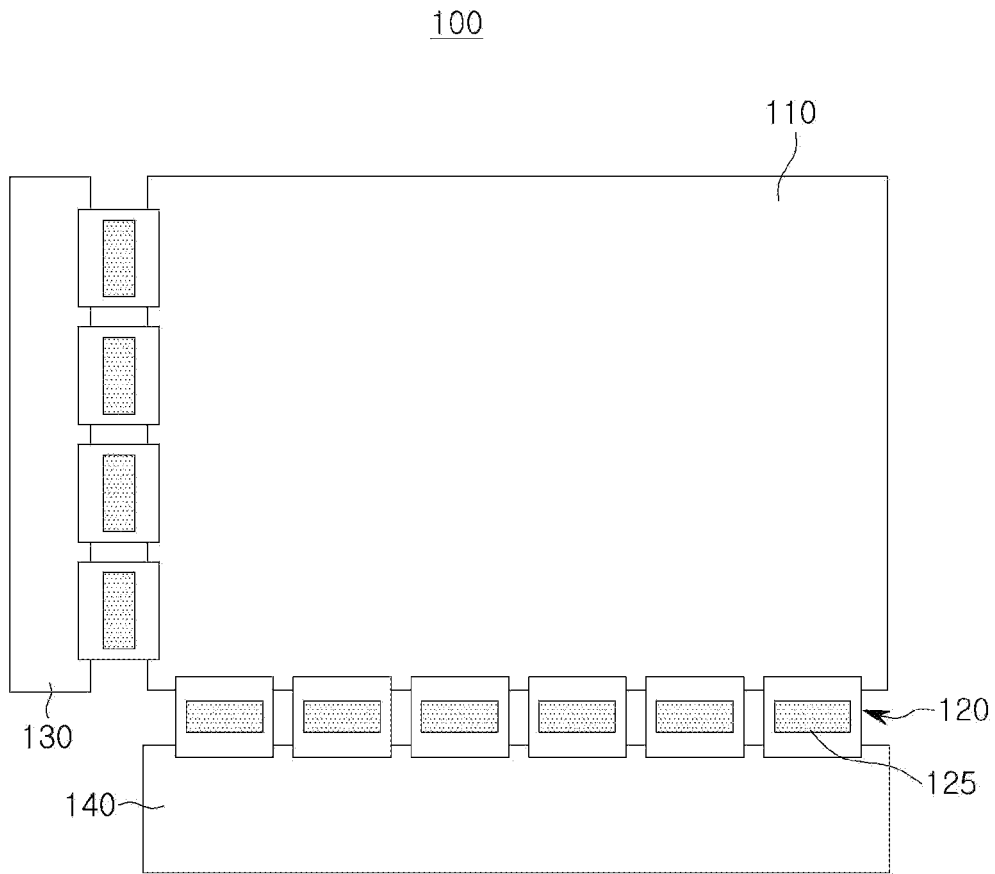
FIG. 1 is a schematic diagram illustrating a display device including a chip-on-film package according to an embodiment of the present inventive concept.

FIG. 1 is a schematic diagram illustrating a display device including a chip-on-film package according to an embodiment of the present inventive concept.

Referring to FIG. 1, a display device 100 according to an embodiment of the present inventive concept includes a display panel 110 on which a plurality of pixels are disposed, a plurality of chip-on-film packages 120, a first circuit board 130, a second circuit board 140, and the like. Each of the first circuit board 130 and the second circuit board 140 may be a rigid printed circuit board (PCB) or a flexible printed circuit board (FPCB).

A plurality of pixels disposed on the display panel 110 may be connected to a plurality of gate lines and a plurality of source lines. For example, a plurality of pixels may be disposed at a plurality of points where a plurality of gate lines and a plurality of source lines intersect. In the display panel 110, a plurality of gate lines and a plurality of source lines may extend in different directions. For example, in the embodiment illustrated in FIG. 1, a plurality of gate lines may extend in a horizontal direction and a plurality of source lines may extend in a vertical direction. The plurality of source lines may be data lines.

Each of the first circuit board 130 and the second circuit board 140 may transfer a control signal to the plurality of chip-on-film packages 120. Each of the plurality of chip-on-film packages 120 may include a semiconductor chip electrically connected to at least some of the plurality of gate lines or at least some of the plurality of source lines. The semiconductor chip may output a driving signal used to display an image to the display panel 110 in response to a control signal received from the first circuit board 130 or the second circuit board 140.

In each of the plurality of chip-on-film packages 120, a semiconductor chip may be mounted on a flexible base film. A plurality of chip pads connected to the semiconductor chip through bumps and a plurality of wiring patterns connected to the plurality of chip pads may be formed on the base film. The plurality of wiring patterns may be connected to some of the plurality of gate lines and some of the plurality of source lines of the display panel 110 through pads formed at a first end of the base film and may be connected to the first circuit board 130 or the second circuit board 140 through pads formed at a second end of the base film.

The plurality of wiring patterns may include a plurality of dummy patterns and a plurality of signal patterns. The plurality of dummy patterns may be connected to a plurality of dummy pads among a plurality of chip pads. In an embodiment, the plurality of dummy pads may be pads to which signals used for the operation of the display device 100 are not transmitted. The plurality of dummy pads may be connected to some of the pads of the semiconductor chip through bumps. Additionally, some of the pads of the semiconductor chip connected to the plurality of dummy pads may not be pads that input/output signals or receive power voltage.

The plurality of signal patterns may be connected to a plurality of signal pads through which signals used for operation of the display device 100 are input and output. For example, gate control signals for driving a plurality of gate lines and data signals for determining grayscale voltages input to a plurality of source lines may be input and output through the plurality of signal pads. In an embodiment, a first end of each of the plurality of signal patterns may be connected to the semiconductor chip, and a second end of each of the plurality of signal patterns may be connected to one of the display panel 110, the first circuit board 130, and the second circuit board 140.

A first end of each of the plurality of dummy patterns may be connected to the semiconductor chip, and a second end of each of the plurality of dummy patterns may be connected to a test pad formed on the base film. The test pad may be formed on the base film and exposed to the outside. A manufacturing process of the display device 100 may include an electrostatic discharge (ESD) test process in which a high voltage, simulating a static electricity environment, is applied to the test pad when the display panel 110, the plurality of chip-on-film packages 120, the first circuit board 130, and the second circuit board 140 are combined. A current generated by the high voltage applied to the test pad may flow through the plurality of dummy patterns during the ESD test process.

When at least one of the plurality of dummy patterns is located close to at least one of the plurality of signal patterns, a current due to the high voltage applied during the ESD test process may flow through at least one of the plurality of signal patterns due to a coupling component. Under such circumstances, the display device's 100 ESD resistance may be deemed inadequate or weak, potentially resulting in a failure of the ESD test process.

In an embodiment of the present inventive concept, ESD resistance of the plurality of chip-on-film packages 120 and the display device 100 including the same may be improved by arranging a plurality of dummy patterns and a plurality of signal patterns in a particular fashion. For example, the plurality of wiring patterns may be disposed such that the smallest distance between the signal pattern and the dummy pattern has a value greater than the smallest distance between the plurality of dummy patterns. In other words, the wiring patterns may be arranged so that the shortest distance between the signal pattern and the dummy pattern exceeds the smallest distance between the dummy patterns themselves. In addition, the arrangement of the plurality of chip pads may also be adjusted so that all of the plurality of wiring patterns may be disposed on one layer. Therefore, in the ESD test, the effect of current flowing through the plurality of dummy patterns on the plurality of signal patterns may be reduced, and the ESD resistance of the plurality of chip-on-film packages 120 and the display device 100 may be improved.

Figure 2:
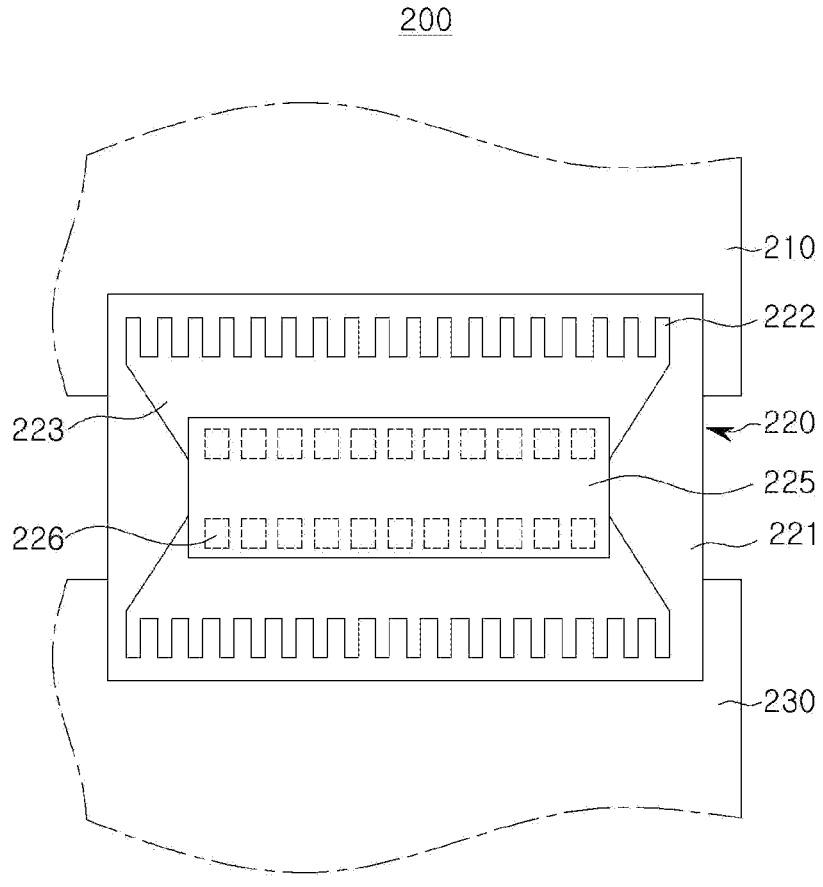
FIGS. 2 and 3 are diagrams illustrating a partial region of a display device according to an embodiment of the present inventive concept.
Figure 3:
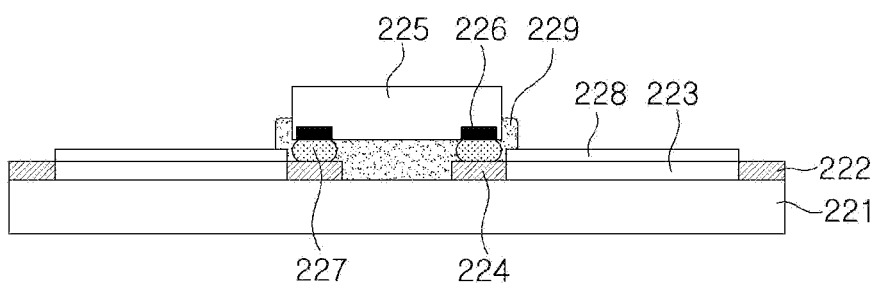

FIGS. 2 and 3 are diagrams illustrating a partial region of a display device according to an embodiment of the present inventive concept.

Referring to FIG. 2, a display device 200 may include a display panel 210, a chip-on-film package 220, and a circuit board 230. A plurality of pixels may be disposed on the display panel 210, and the chip-on-film package 220 may be connected to the display panel 210 and the circuit board 230.

The chip-on-film package 220 may include a base film 221 and a semiconductor chip 225. A plurality of pads 222 and a plurality of wiring patterns 223 may be formed on the base film 221. The plurality of wiring patterns 223 may be covered with a protective layer 228.

Referring to FIGS. 2 and 3 together, some of the plurality of pads 222 may be connected to the display panel 210 and others of the plurality of pads 222 may be connected to the circuit board 230. For example, the pads 222 on the upper side of the chip-on-film package 220 may be connected to the display panel 210 and the pads 222 on the lower side of the chip-on-film package 220 may be connected to the circuit board 230. Additionally, some of the plurality of pads 222 may be referred to as chip pads 224 connected to pads 226 of the semiconductor chip 225 through bumps 227. The bumps 227 may be covered with a sealing member 229 formed of a polymer material or the like.

The plurality of wiring patterns 223 may be connected to the plurality of pads 222. More specifically, one of the wiring patterns 223 may be connected between one of the pads 222 and one of the chip pads 224. For example, the plurality of wiring patterns 223 may include a plurality of signal patterns used to transmit signals between the display panel 210 and the circuit board 230 and a plurality of dummy patterns not used for signal transmission. For example, at least some of the plurality of dummy patterns may be used for an ESD test of the display device 200.

In an embodiment, the plurality of dummy patterns may include a first dummy pattern and a second dummy pattern, and each of the first dummy pattern and the second dummy pattern may be connected to at least one of the plurality of chip pads 224. In addition, the first dummy pattern may be connected to a first test pad, the second dummy pattern may be connected to a second test pad, and the first test pad and the second test pad may be exposed to the outside of the chip-on-film package 220.

While the ESD test of the display device 200 is in progress, a high voltage simulating a static electricity environment may be applied to the first test pad and/or the second test pad. For example, in the ESD test, a voltage of 1 kV or more may be applied to the first test pad and/or the second test pad, and a current generated thereby may flow through the plurality of dummy patterns. In this case, if there is not adequate between the plurality of dummy patterns and the plurality of signal patterns, the voltage applied to the first test pad and/or the second test pad may affect at least one of the plurality of signal patterns due to a coupling component. As a result, ESD resistance of the display device 200 may drop, leading to a potential failure in the ESD test.

In an embodiment of the present inventive concept, the plurality of wiring patterns 223 are disposed such that an adequate distance is secured between the plurality of signal patterns and the plurality of dummy patterns, thereby improving the ESD resistance of the display device 200. This will be described in more detail with reference to FIG. 4 hereinafter.

Figure 4:
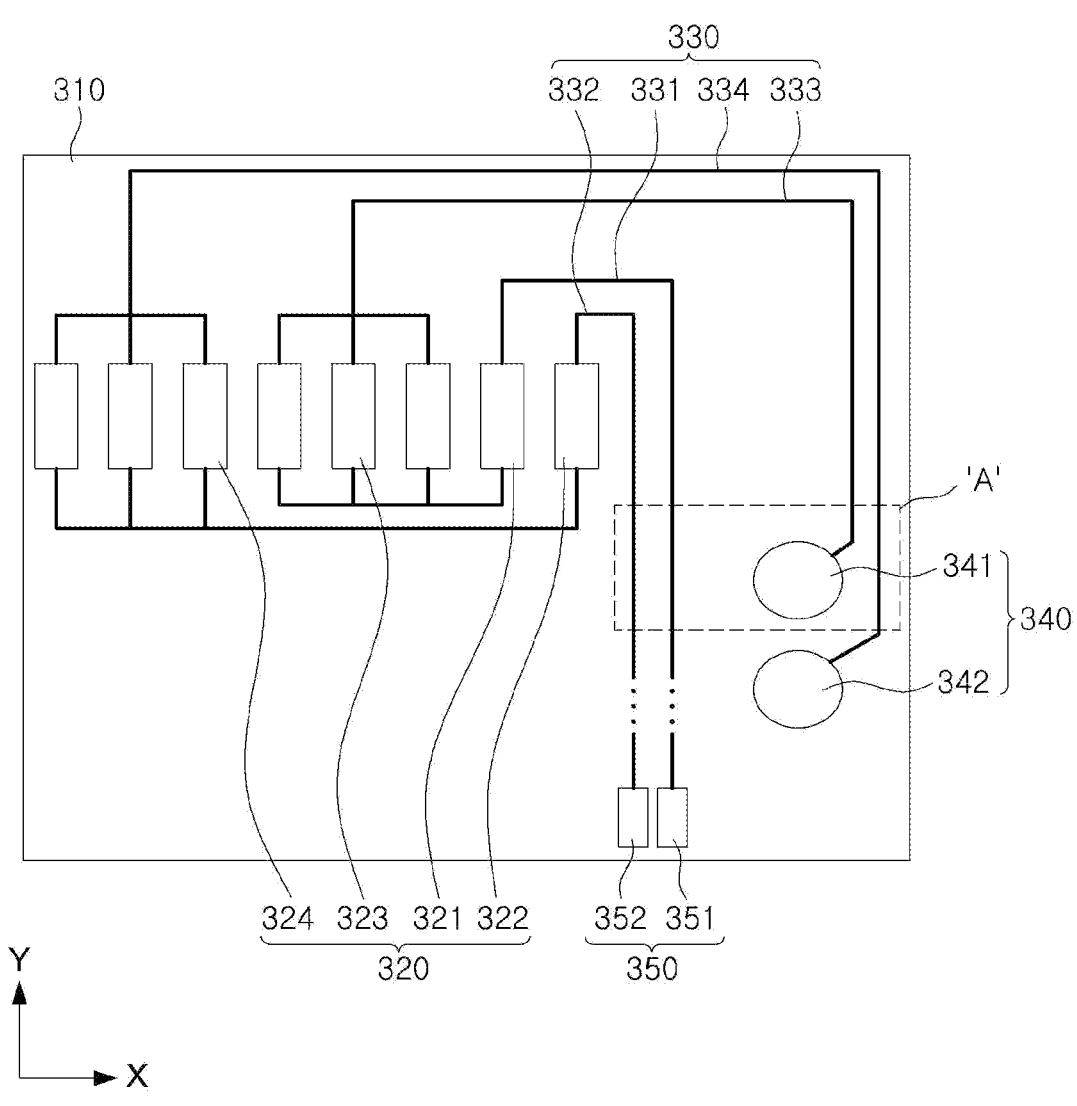
FIG. 4 is a diagram illustrating a chip-on-film package according to an embodiment of the present inventive concept.

FIG. 4 is a schematic diagram illustrating a chip-on-film package according to an embodiment of the present inventive concept.

Referring to FIG. 4, a chip-on-film package 300 according to an embodiment of the present inventive concept may include a base film 310, a plurality of chip pads 320, a plurality of wiring patterns 330, and the like. The base film 310 may be a flexible substrate, and the plurality of chip pads 320 and the plurality of wiring patterns 330 may be formed of a conductive material on the base film 310. The plurality of chip pads 320 may be formed in a mounting region in which a semiconductor chip is mounted, and may be electrically connected to pads of the semiconductor chip by bumps.

The plurality of chip pads 320 may include a first signal pad 321, a second signal pad 322, a first dummy pad 323, a second dummy pad 324, and the like. The chip-on-film package 300 according to the embodiment illustrated in FIG. 4 may include a plurality of first dummy pads 323 and a plurality of second dummy pads 324.

The plurality of wiring patterns 330 may include signal patterns 331 and 332 transmitting signals used to operate the display device and dummy patterns 333 and 334 that do not transmit signals. The first signal pattern 331 may be connected to the first signal pad 321, and the second signal pattern 332 may be connected to the second signal pad 331. A first end of the first dummy pattern 333 may be connected to the plurality of first dummy pads 323 and a first end of the second dummy pattern 334 may be connected to the plurality of second dummy pads 324.

The chip-on-film package 300 may include a plurality of test pads 340 and a plurality of pads 350 exposed to the outside of the base film 310. For example, a first test pad 341 may be connected to the first dummy pattern 333 and a second test pad 342 may be connected to the second dummy pattern 334. The first pad 351 may be connected to the first signal pattern 331 and the second pad 352 may be connected to the second signal pattern 332. The first test pad 341 and the second test pad 342 are exposed to the outside and may receive a high voltage when the ESD test is performed.

The first pad 351 and the second pad 352 may be connected to a circuit board or a display panel. For example, when the first pad 351 and the second pad 352 are respectively connected to a first source line and a second source line formed on the display panel, a grayscale voltage output to the first signal pad 331 may be input to the first source line through the first pad 351 and a grayscale voltage output to the second signal pad 332 may be input to the second source line through the second pad 352.

In an embodiment of the present inventive concept, the plurality of first dummy pads 323 and the plurality of second dummy pads 324 may be continuously arranged in one direction (an X-axis direction), parallel to an upper surface of the base film 310. For example, referring to FIG. 4, the plurality of first dummy pads 323 and the plurality of second dummy pads may be are continuously arranged, and the first signal pad 321 and the second signal pad 322 may be disposed on one side thereof. In other words, no other pad may be provided between the plurality of first dummy pads 323 and the plurality of second dummy pads 324. More specifically, in FIG. 4, there first dummy pads 323 may be arranged in sequence followed by three second dummy pads 324 arranged in sequence with no pads between adjacent ones of the first and second dummy pads 323 and 324. The first dummy pads 323 may be electrically connected to the first signal pad 321 by a wiring pattern formed on the base film 310 or a circuit inside the semiconductor chip mounted on the plurality of chip pads 320. In other words, each of the first dummy pads 323 is connected to the first signal pad 321 by the wiring pattern. Similarly, the plurality of second dummy pads 324 may be electrically connected to the second signal pad 322 by a wiring pattern formed on the base film 310 or a circuit inside the semiconductor chip mounted on the plurality of chip pads 320. The number of first dummy pads 323 connected to the first signal pads 321 may be greater than the number of first signal pads 321 and the number of second dummy pads 324 connected to the second signal pads 322 may also be greater than the number of second signal pads 322.

In an embodiment illustrated in FIG. 4, the plurality of second dummy pads 324, the plurality of first dummy pads 323, the first signal pad 321, and the second signal pad 322 may be arranged in order in the one direction. In addition, the plurality of first dummy pads 323 may be arranged between the plurality of second dummy pads 324 and the first signal pad 321 in the one direction, and the first signal pad 321 may be disposed between the plurality of first dummy pads 323 and the second signal pad 322.

The arrangement order of the plurality of wiring patterns 330 may be similar to the arrangement order of the plurality of chip pads 320. For example, the first signal pattern 331 may be disposed between the second signal pattern 332 and the first dummy pattern 333 in the one direction, and the first dummy pattern 333 may be disposed between the second dummy pattern 334 and the first signal pattern 331 in the one direction. Accordingly, as illustrated in FIG. 4, the first dummy pattern 333 may be adjacent to the second dummy pattern 334 on one side in the one direction and may be adjacent to the first signal pattern 331 on the opposite side of the one direction. By arranging the plurality of chip pads 320 and the plurality of wiring patterns 330 as described above, all of the plurality of wiring patterns 330 may be arranged on one layer on the base film 310.

In the ESD test, a high voltage may be applied to the first test pad 341 and/or the second test pad 342, and a resulting current may flow to the first dummy pattern 333 and the second dummy pattern 343. In this case, a current for the ESD test may be directly applied to the first signal pattern 331 due to a coupling component between the first dummy pattern 333 and the first signal pattern 331. Accordingly, ESD characteristics of the chip-on-film package 300 may be deteriorated.

In an embodiment of the present inventive concept, as illustrated in FIG. 4, a plurality of chip pads 320 and a plurality of wiring patterns 330 are arranged so that a distance between the first signal pattern 331 and the first dummy pattern 333 adjacent to each other may be sufficiently secured. For example, a distance between the first signal pattern 331 and the first dummy pattern 333 may be made to increase, and a coupling component between the first signal pattern 331 and the first dummy pattern 333 may decrease. Therefore, in the ESD test, the effect of the current flowing through the first dummy pattern 333 on the first signal pattern 331 due to the coupling component may be reduced, and the ESD characteristics of the chip-on-film package 300 may be improved.

In an embodiment, a distance between the first signal pattern 331 and the first dummy pattern 333 adjacent to each other may be greater than a distance between the first and second dummy patterns 333 and 334. Additionally, a distance between the first signal pattern 331 and the first dummy pattern 333 may be greater than the distance between the first and second signal patterns 331 and 332. This will be described in more detail with reference to FIG. 5 hereinafter.

Figure 5:
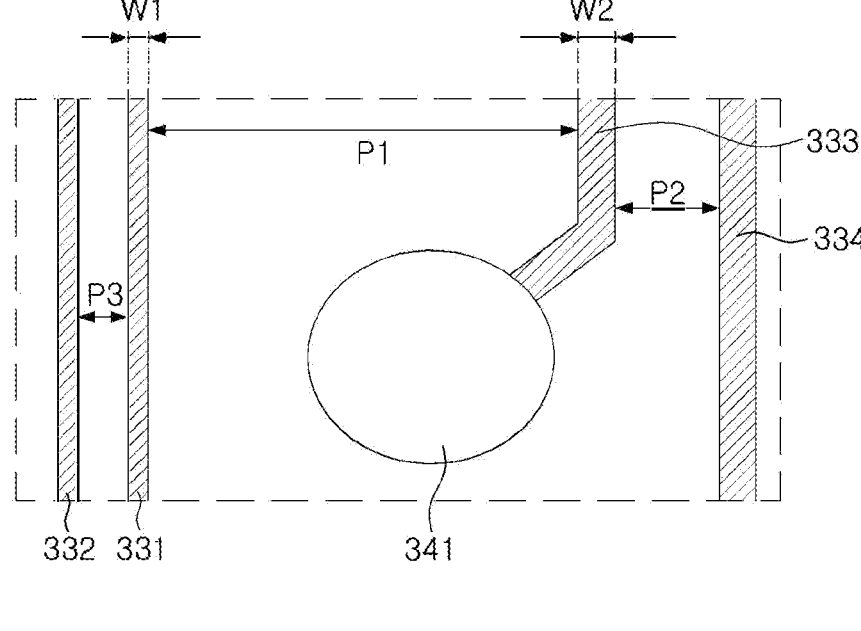
FIG. 5 is an enlarged view of region A of FIG. 4.

FIG. 5 is an enlarged view of region A of FIG. 4.

Referring to FIG. 5, each of the first signal pattern 331 and the second signal pattern 332 may have a first line width W1, and each of the first dummy pattern 333 and the second dummy pattern 334 may have a second line width W2. The second line width W2 may be greater than the first line width W1.

In addition, a first distance P1 between the first signal pattern 331 and the first dummy pattern 333 adjacent to each other may be greater than a second distance P2 between the first dummy pattern 333 and the second dummy pattern 334 adjacent to each other. Additionally, the first distance P1 between the first signal pattern 331 and the first dummy pattern 333 adjacent to each other may be greater than a third distance P3 between the first signal pattern 331 and the second signal pattern 332 adjacent to each other. For example, the first distance P1 may be twice or more than the second distance P2.

The second distance P2 may be greater than the third distance P3.

Figure 6:
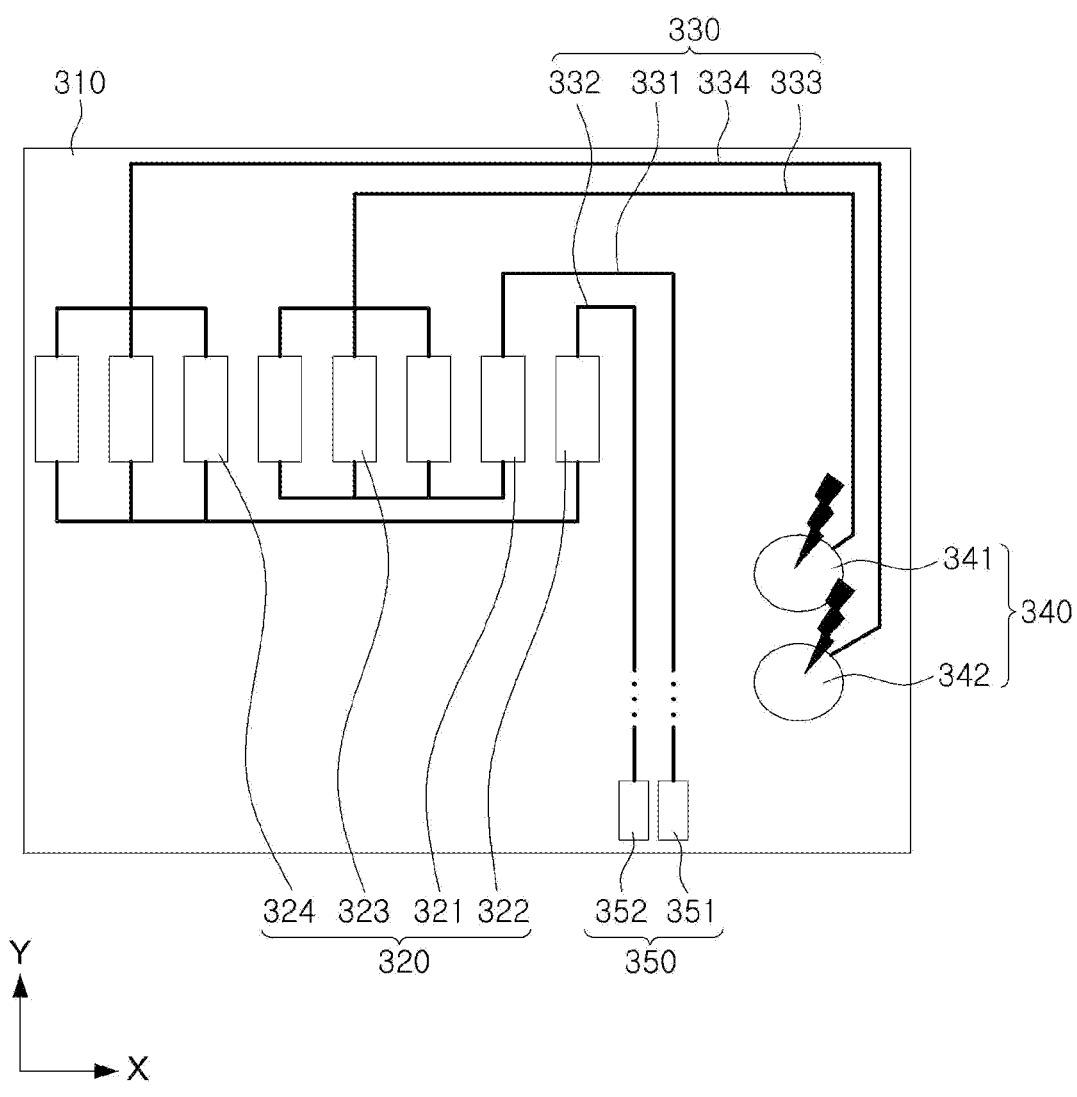
FIGS. 6 and 7 are diagrams illustrating electrostatic discharge (ESD) characteristics of a chip-on-film package according to an embodiment of the present inventive concept.
Figure 7:
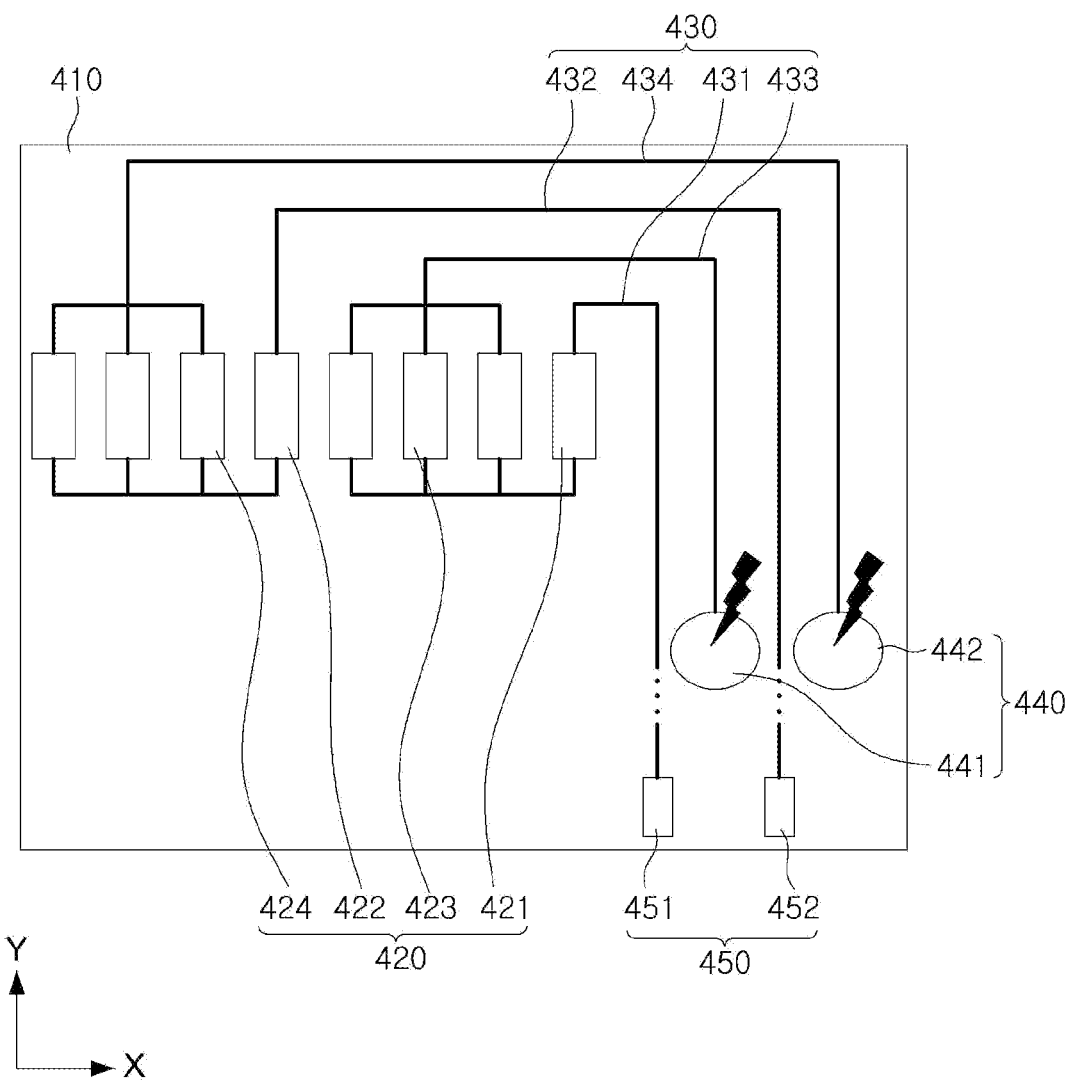

FIGS. 6 and 7 are diagrams illustrating ESD characteristics of a chip-on-film package according to an embodiment of the present inventive concept.

FIG. 6 may be a diagram illustrating a chip-on-film package 300 according to an embodiment of the present inventive concept. The chip-on-film package 300 of the embodiment illustrated in FIG. 6 may have a structure such as that described above with reference to FIG. 4. When an ESD test for testing the ESD characteristics of the chip-on-film package 300 starts, a voltage simulating the occurrence of static electricity in the first test pad 341 and the second test pad 342 may be applied by a circuit simulating the occurrence of static electricity.

For example, the voltage applied to the first test pad 341 and the second test pad 342 may be a high voltage of 1 kV or more. A current flowing through the first dummy pattern 333 and the second dummy pattern 334 may be generated by the voltage applied to the first test pad 341 and the second test pad 342. In the embodiment illustrated in FIG. 6, the first dummy pattern 333 and the second dummy pattern 334 may be separated from the first signal pattern 331 and the second signal pattern 332 by a sufficient distance. Accordingly, a coupling component between the first dummy pattern 333 and the first signal pattern 331 adjacent thereto may be reduced, and the effect of a current flowing through the first and second dummy patterns 333 and 334 on the first and second signal patterns 331 and 332 in the ESD test may be effectively suppressed. In other words, the first signal pattern 331 is positioned at a sufficient distance from the first dummy pattern 333 to ensure that any current flowing through the first dummy pattern 333 does not impact the first signal pattern 331. As a result, ESD characteristics of the chip-on-film package 300 may be improved.

FIG. 7 is a diagram illustrating a chip-on-film package 400 according to the Comparative Example, not an embodiment of the present inventive concept. Referring to FIG. 7, in the Comparative Example, a first signal pad 421 among a plurality of chip pads 420 may be continuously arranged with a plurality of first dummy pads 423 in one direction (the X-axis direction), parallel to an upper surface of a base film 410. In addition, a second signal pad 422 may be continuously disposed with a plurality of second dummy pads 424 in the one direction. Accordingly, the second signal pad 422 may be disposed between the plurality of first dummy pads 423 and the plurality of second dummy pads 424.

The plurality of chip pads 420 may be connected to a plurality of wiring patterns 430, and the arrangement order of the plurality of wiring patterns 430 may correspond to the arrangement order of the plurality of chip pads 420. As illustrated in FIG. 7, a first signal pattern 431, a first dummy pattern 433, a second signal pattern 432, and a second dummy pattern 434 may be sequentially arranged. Accordingly, the second signal pattern 432 may be disposed between the first dummy pattern 433 connected to a first test pad 441 among test pads 440 and the second dummy pattern 434 connected to a second test pad 442.

As a result, in the Comparative example described above with reference to FIG. 7, a sufficient distance may not be secured between the first and second signal patterns 431 and 432 and first and second the dummy patterns 433 and 434, and therefore, in the ESD test, current flowing through the first and second dummy patterns 433 and 434 may flow into the first and second signal patterns 431 and 432 due to a coupling component.

For example, the ESD test of the chip-on-film package 400 may be performed while the chip-on-film package 400 is attached to a display panel. When the current flowing through the first and second dummy patterns 433 and 434 flows into the first and second signal patterns 431 and 432 due to the high voltage applied to the test pads 440, current may flow up to a plurality of pads 450 connecting the first and second signal patterns 431 and 432 to a gate wiring or a source wiring of the display panel. The display panel may include a glass substrate on which gate wirings and source wirings are formed, and as current flows into the plurality of pads 450, at least one of a first pad 451 and a second pad 452 may be damaged and be separated from the display panel.

However, as described above with reference to FIG. 6, in an embodiment of the present inventive concept, since a sufficient distance is secured between the first and second dummy patterns 333 and 334 and the first and second signal patterns 331 and 332, current due to the high voltage applied to the test pads 340 may not directly flow into the first and second signal patterns 331 and 332 due to a coupling component. Therefore, in the ESD test, current may not flow into the first and second signal patterns 331 and 332 due to the coupling component, damage to the first pad 351 and the second pad 352 connected to the display panel may be prevented, and ESD resistance of the display device, as well as the chip-on-film package 400, may be enhanced.

FIGS. 8 to 11 are views illustrating a chip-on-film package according to an embodiment of the present inventive concept.

Figure 8:
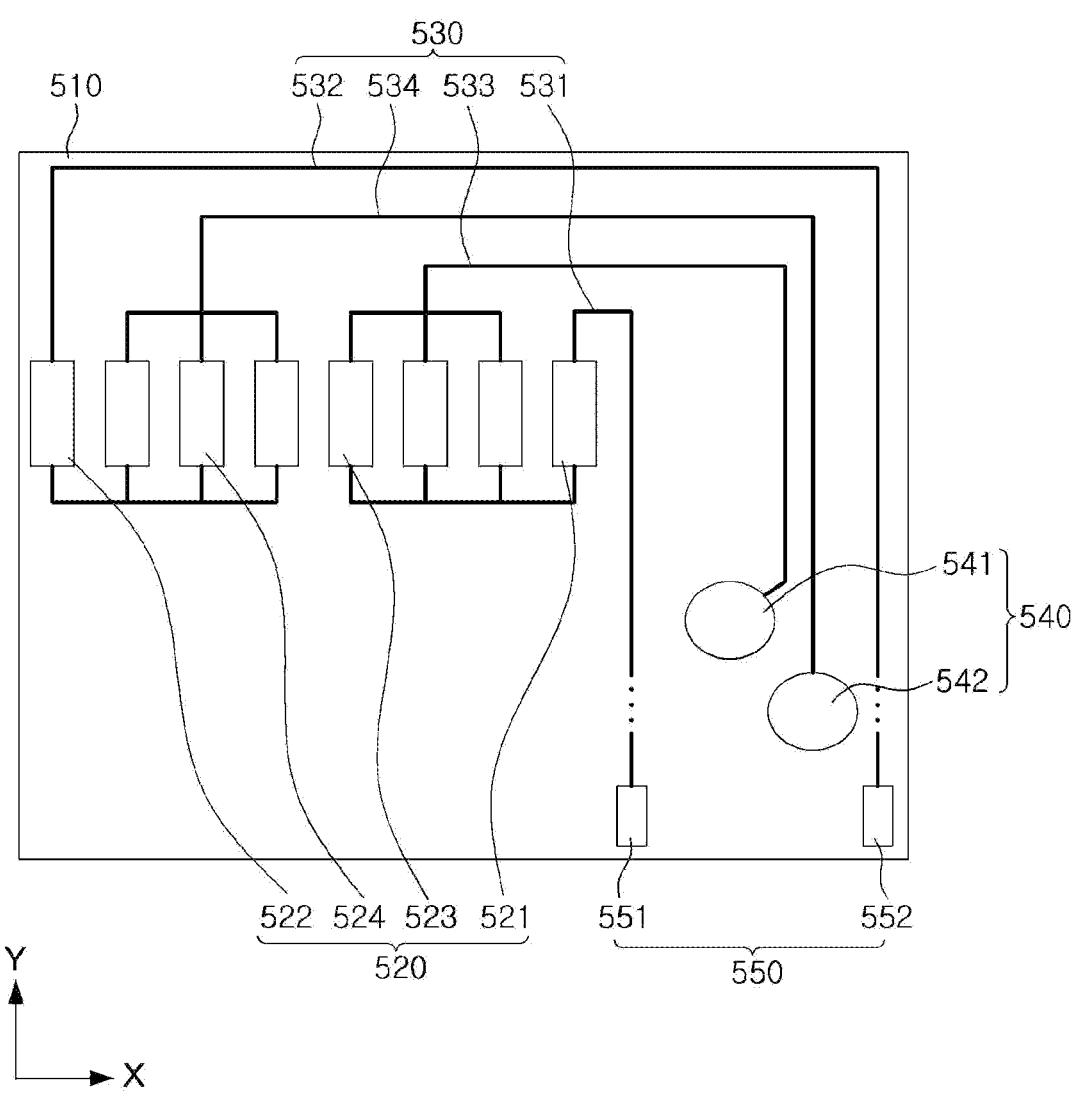
FIGS. 8, 9, 10 and 11 are diagrams illustrating a chip-on-film package according to an embodiment of the present inventive concept.

Referring first to FIG. 8, a chip-on-film package 500 according to an embodiment of the present inventive concept may include a base film 510, a plurality of chip pads 520, a plurality of wiring patterns 530, a plurality of test pads 540, and a plurality of pads 550. In the embodiment illustrated in FIG. 8, a plurality of first dummy pads 523 and a plurality of second dummy pads 524 may be sequentially arranged between a first signal pad 521 and a second signal pad 522 in one direction (the X-axis direction), parallel to an upper surface of the base film 510. For example, the first signal pad 521 and the plurality of first dummy pads 523 may be adjacent to each other, and the second signal pad 522 and the plurality of second dummy pads 524 may be adjacent to each other.

Additionally, a first dummy pattern 533 and a second dummy pattern 534 may be arranged between a first signal pattern 531 connected to a first pad 551 and the first signal pad 521 and a second signal pattern 532 connected to a second pad 552 and the second signal pad 522. The first dummy pattern 533 may be connected to a first test pad 541, and the second dummy pattern 534 may be connected to a second test pad 542.

In the embodiment illustrated in FIG. 8, a distance between the first dummy pattern 533 and the second dummy pattern 534 may be greater than a distance between the first dummy pattern 533 and the first signal pattern 531 and a distance between the second dummy pattern 534 and the second signal pattern 532. Therefore, current due to the high voltage applied to the test pads 540 for the ESD test may be effectively prevented from flowing into the first signal pattern 531 and the second signal pattern 532 due to a coupling component.

In regards to the distance between the plurality of wiring patterns 531 to 534, in order to reduce a distance between the first and second dummy patterns 533 and 534 and sufficiently secure a distance between one of the first and second dummy patterns 533 and 534 and one of the first and second signal patterns 531 and 532, the first test pad 541 and the second test pad 542 may be disposed in different positions in another direction (a Y-axis direction), intersecting the one direction. For example, the first test pad 541 and the second test pad 542 may be offset from one another. As illustrated in FIG. 8, the first test pad 541 and the second test pad 542 may be formed in different positions in the other direction, and at least one of the first and second dummy patterns 533 and 534 may be formed to have a diagonal region extending in a direction, intersecting the one direction and the other direction. From this structure, the distance between the first and second dummy patterns 533 and 534 may be reduced and the distance between the first and second dummy patterns 533 and 534 and the first and second signal patterns 531 and 532 may be increased.

Figure 9:
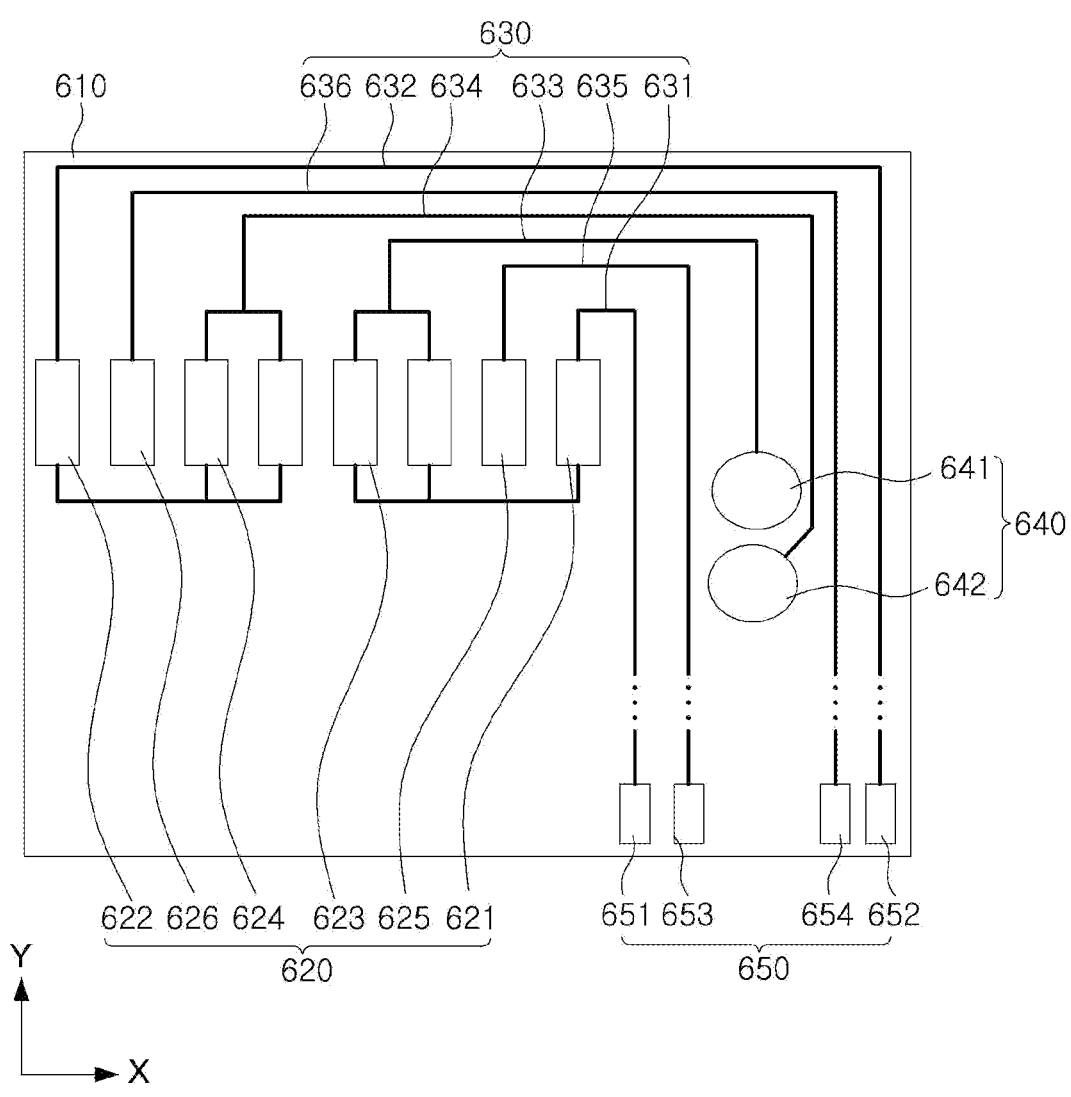

Next, referring to FIG. 9, a chip-on-film package 600 according to an embodiment of the present inventive concept may include a base film 610, a plurality of chip pads 620, a plurality of wiring patterns 630, a plurality of test pads 640, and a plurality of pads 650. In the embodiment illustrated in FIG. 9, a plurality of first dummy pads 623, a plurality of second dummy pads 624, and power pads 625 and 626 may be sequentially arranged between a first signal pad 621 and a second signal pad 622 in one direction (the X-axis direction), parallel to an upper surface of the base film 610.

For example, the first power pad 625 may be disposed between the first signal pad 621 and the plurality of first dummy pads 623, and the second power pad 626 may be disposed between the second signal pad 622 and the plurality of second dummy pads 624. In addition, the plurality of first dummy pads 623 and the plurality of second dummy pads 624 may be disposed between the first power pad 625 and the second power pad 626.

The first power pad 625 and the second power pad 626 may be used to receive a power supply voltage from a semiconductor chip connected to the plurality of chip pads 620 through bumps. In an embodiment, power supply voltages of the same level may be supplied through the first power pad 625 and the second power pad 626.

When a high voltage simulating the occurrence of static electricity is applied to a first test pad 641 and a second test pad 642 for an ESD test, while the chip-on-film package 600 is attached to the display panel, a current may flow through a first dummy pattern 633 and a second dummy pattern 634. In this case, when a current due to a coupling component flows into a first signal pattern 631 adjacent to the first dummy pattern 633 and a second signal pattern 632 adjacent to the second dummy pattern 634, the chip-on-film package and the display device including the same may not pass the ESD test.

In the embodiment illustrated in FIG. 9, a first power pattern 635 may be disposed between the first dummy pattern 633 and the first signal pattern 631, and a second power pattern 636 may be disposed between the second dummy pattern 634 and the second signal pattern 632. The first power pattern 635 may provide a shielding effect between the first dummy pattern 633 and the first signal pattern 631. Similarly, the second power pattern 636 may provide a shielding effect between the second dummy pattern 634 and the second signal pattern 632. In other words, the first and second power patterns 635 and 636 may also serve as shields.

Referring to FIG. 9, the first power pattern 635 may be connected to a first power pad 653 among the plurality of pads 650, and the second power pattern 636 may be connected to a second power pad 654 among the plurality of pads 650. A power supply voltage of a predetermined level may be supplied to the display panel by the first power pattern 635 and the second power pattern 636. The plurality of pads 650 may further include pads 651 and 652 respectively connected to the first and second signal patterns 631 and 632.

Figure 10:
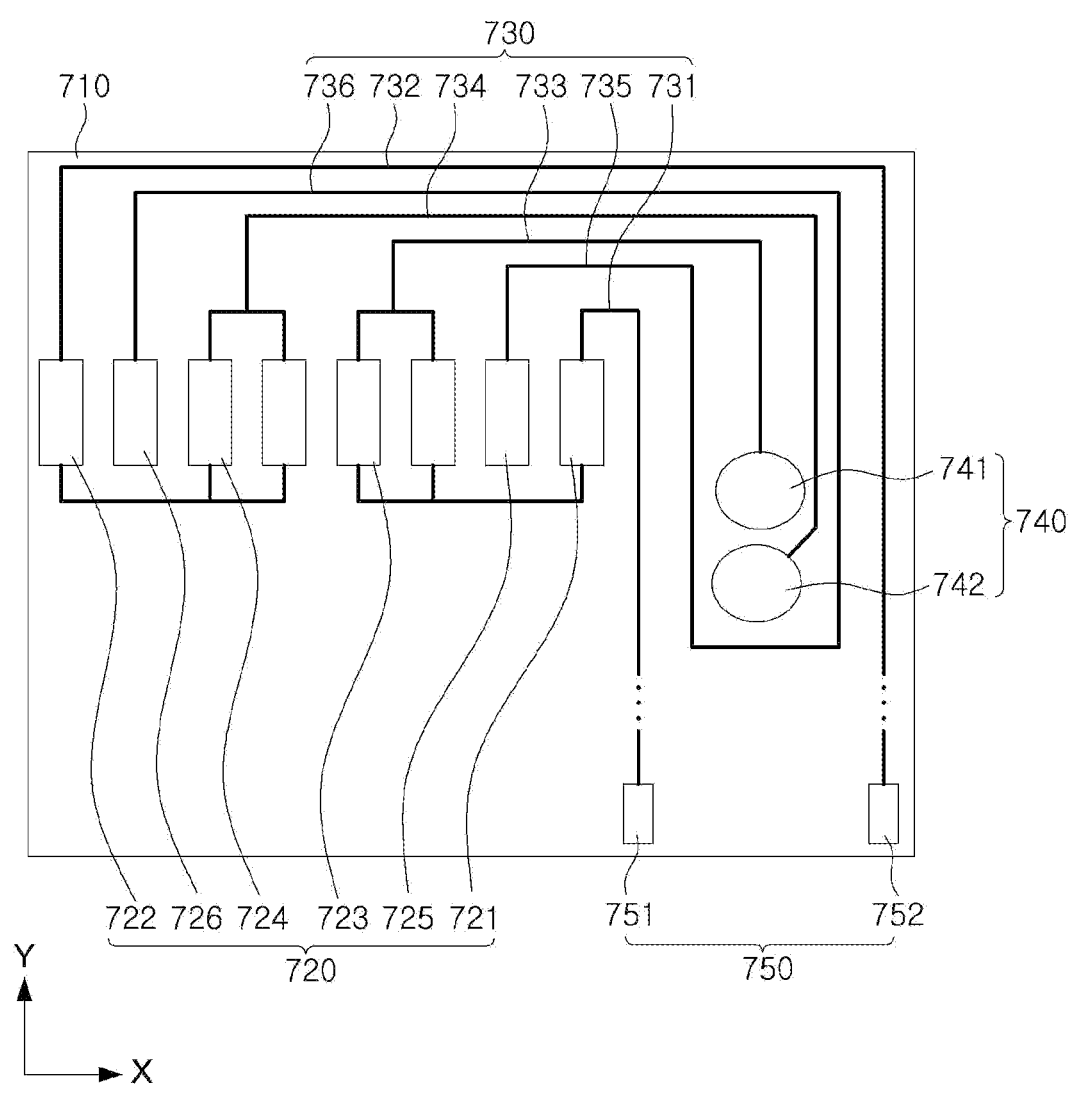

Referring to FIG. 10, a chip-on-film package 700 according to an embodiment of the present inventive concept may include a base film 710, a plurality of chip pads 720, a plurality of wiring patterns 730, a plurality of test pads 740, and a plurality of pads 750. In the embodiment illustrated in FIG. 10, a plurality of first dummy pads 723 and a plurality of second dummy pads 724, and power pads 725 and 726 may be sequentially arranged between a first signal pad 721 and a second signal pad 722 in one direction (the X-axis direction), parallel to an upper surface of the base film 710.

Similar to the embodiment described above with reference to FIG. 9, a first power pad 725 may be disposed between the first signal pad 721 and the plurality of first dummy pads 723. Accordingly, a first power pattern 735 connected to the first power pad 725 may provide a shielding effect to reduce a coupling between a first signal pattern 731 and a first dummy pattern 733. Similarly, a second power pattern 736 connected to the second power pad 726 may provide a shielding effect to reduce a coupling between a second signal pattern 732 and a second dummy pattern 734.

Unlike the embodiment described above with reference to FIG. 9, in the embodiment illustrated in FIG. 10, the first power pattern 735 and the second power pattern 736 may be connected to each other. Referring to FIG. 10, the first power pattern 735 and the second power pattern 736 may be connected to each other, and thus, at least one of a first test pad 741 and a second test pad 742 may be adjacent to the first power pattern 735 and the second power pattern 736 in three different directions. In other words, the first power pattern 735 and the second power pattern 736 may be disposed on three sides of the first power pattern 735 and the second power pattern 736. Therefore, a shielding effect using the first and second power patterns 735 and 736 may be increased. In the embodiment illustrated in FIG. 10, since the first power pattern 735 and the second power pattern 736 are connected to each other, pads connected to the power patterns 735 and 736 may not be formed on the base film 710. The plurality of pads 750 may further include pads 751 and 752 respectively connected to the first and second signal patterns 731 and 732.

Figure 11:
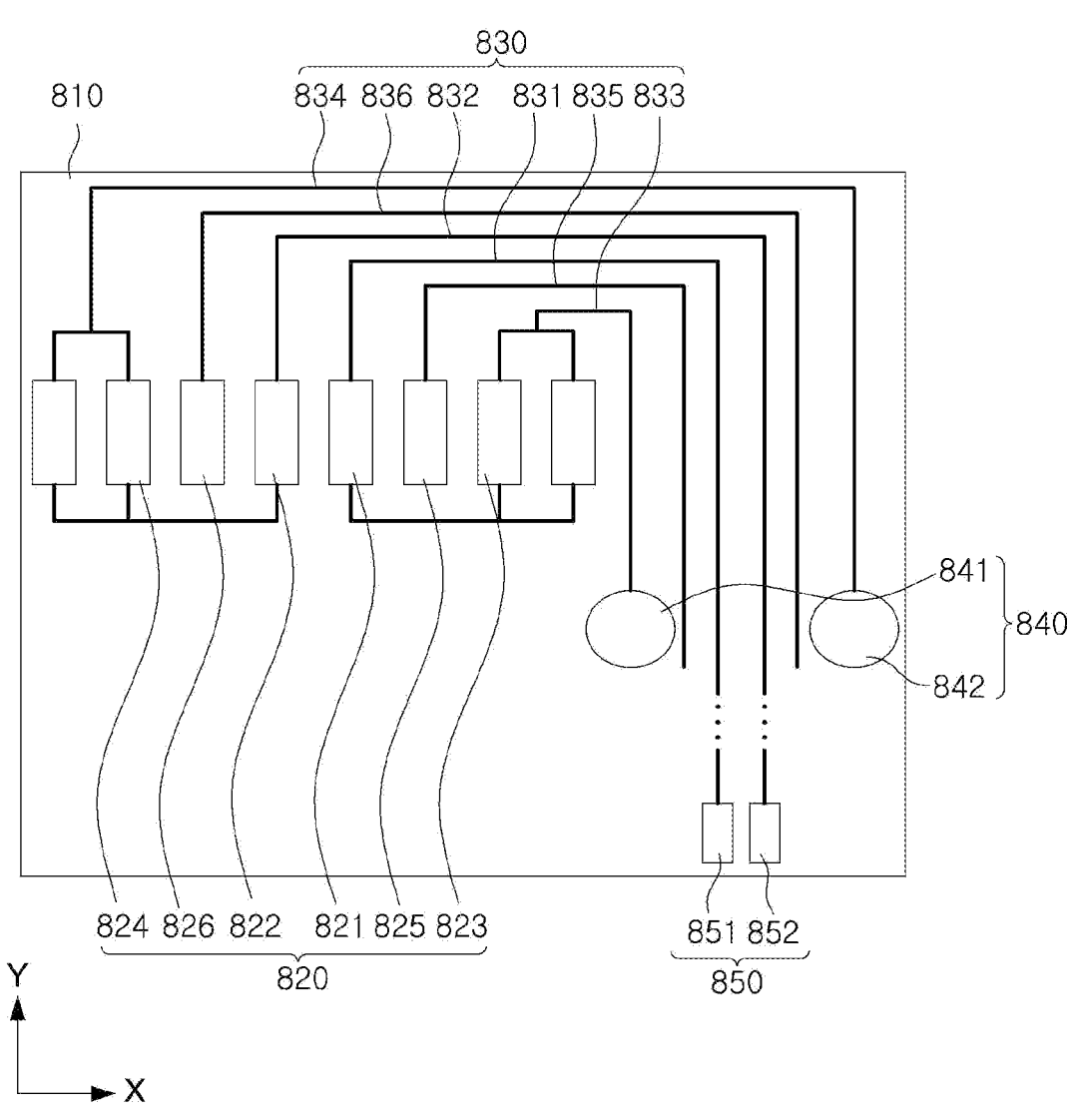

Next, referring to FIG. 11, a chip-on-film package 800 according to an embodiment of the present inventive concept may include a base film 810, a plurality of chip pads 820, a plurality of wiring patterns 830, a plurality of test pads 840, and a plurality of pads 850. In the embodiment illustrated in FIG. 11, a first signal pad 821 and a second signal pad 822 may be disposed to be adjacent to each other in one direction (the X-axis direction), parallel to an upper surface of the base film 810. In other words, another chip pad may not be disposed between the first signal pad 821 and the second signal pad 822.

A first power pad 825 may be disposed between the first signal pad 821 and a plurality of first dummy pads 823 in one direction, and a second power pad 826 may be disposed between the second signal pad 822 and a plurality of second dummy pads 824 in the one direction. Therefore, among the plurality of wiring patterns 830, a first power pattern 835 may be disposed between a first signal pattern 831 and a first dummy pattern 833, and a second power pattern 836 may be disposed between a second signal pattern 832 and a second dummy pattern 834. Each of the first power pattern 835 and the second power pattern 836 may provide a shielding effect.

In the embodiment illustrated in FIG. 11, the first and second signal patterns 831 and 832 and the first and second power patterns 835 and 836 may be disposed between a first test pad 841 and a second test pad 842 in one direction. One end of each of the first and second power patterns 835 and 836 not connected to the first and second power pads 825 and 826 may be floated or may be connected to a power pad connected to the display panel as described above with reference to FIG. 9. The plurality of pads 850 may further include pads 851 and 852 respectively connected to the first and second signal patterns 831 and 832.

The chip-on-film packages according to various embodiments of the present inventive concept may be applied to other devices, for example, a touch screen device, in addition to a display device. For example, when the touch screen panel is connected to the chip-on-film package, the signal patterns may be connected to a plurality of sensing lines included in the touch screen panel, and the dummy patterns connected to the test pads may be arranged between the signal patterns. However, the distance between the dummy patterns and the signal patterns adjacent to each other may be greater than the distance between the dummy patterns and the distance between the signal patterns.

According to an embodiment of the present inventive concept, a sufficient distance may be secured between the signal patterns and the dummy patterns by appropriately arranging the signal pads connected to the signal patterns and the dummy pads connected to the dummy patterns. The distance between the signal pattern and the dummy pattern adjacent to each other may be greater than the distance between the adjacent dummy patterns. Therefore, in an ESD test in which static electricity is applied to a dummy pattern in a state in which the display panel is coupled to the chip-on-film package, resistance to static electricity may be enhanced, and the reliability of the chip-on-film package and the display device may be improved.

While example embodiments have been illustrated and described above, it will be apparent to those skilled in the art that modifications and variations could be made thereto without departing from the scope of the present inventive concept as set forth by the appended claims.

What is claimed is:

1. A chip-on-film package comprising:
a base film attached to a display panel;
a plurality of chip pads including a first signal pad, a second signal pad, a plurality of first dummy pads, and a plurality of second dummy pads, wherein the plurality of chip pads is connected to a semiconductor chip attached to the base film; and
a plurality of wiring patterns including a first signal pattern connected to the first signal pad, a second signal pattern connected to the second signal pad, a first dummy pattern connected to the plurality of first dummy pads, and a second dummy pattern connected to the plurality of second dummy pads,
wherein
the plurality of first dummy pads and the plurality of second dummy pads are continuously disposed in a first direction,
the first dummy pattern is disposed between the first signal pattern and the second dummy pattern,
the first signal pattern is disposed between the first dummy pattern and the second signal pattern, in the first direction,
in the first direction, a shortest distance between the first dummy pattern and the first signal pattern is greater than at least one of a shortest distance between the first dummy pattern and the second dummy pattern and a shortest distance between the first signal pattern and the second signal pattern,
the first dummy pattern is connected to a first test pad and the second dummy pattern is connected to a second test pad, and
the first test pad and the second test pad are separated from the display panel.

2. The chip-on-film package of claim 1, wherein the distance between the first dummy pattern and the first signal pattern is two times or more than the distance between the first dummy pattern and the second dummy pattern.

3. The chip-on-film package of claim 1, wherein
a first end of the first dummy pattern is connected to the plurality of first dummy pads and a second end of the first dummy pattern is connected to the first test pad, and a first end of the second dummy pattern is connected to the plurality of second dummy pads and a second end of the second dummy pattern is connected to the second test pad.

4. The chip-on-film package of claim 3, wherein the first test pad and the second test pad are adjacent to each other, and at least one of the plurality of wiring patterns is disposed between the first test pad, the second test pad, and the plurality of chip pads.

5. The chip-on-film package of claim 3, wherein a line width of each of the first dummy pattern and the second dummy pattern is greater than a line width of each of the first signal pattern and the second signal pattern.

6. The chip-on-film package of claim 3, wherein an area of each of the first test pad and the second test pad is greater than an area of each of the plurality of chip pads.

7. The chip-on-film package of claim 1, wherein, in the first direction, the plurality of first dummy pads and the plurality of second dummy pads are sequentially arranged, and the first signal pad and the second signal pad are arranged on one side of the plurality of first dummy pads.

8. The chip-on-film package of claim 7, wherein the first signal pad is disposed between the plurality of first dummy pads and the second signal pad.

9. The chip-on-film package of claim 1, wherein, in the first direction, the plurality of first dummy pads and the plurality of second dummy pads are sequentially arranged between the first signal pad and the second signal pad.

10. The chip-on-film package of claim 9, wherein, in the first direction, the plurality of second dummy pads are arranged between the plurality of first dummy pads and the second signal pad, and the plurality of first dummy pads are arranged between the plurality of second dummy pads and the first signal pad.

11. The chip-on-film package of claim 1, wherein the plurality of patterns include a first power pattern to which a first power supply voltage is applied, and a second power pattern to which a second power supply voltage is applied, the plurality of chip pads include a first power pad connected to the first power pattern and a second power pad connected to the second power pattern, and in the first direction, the first power pad is disposed between the first signal pad and the plurality of first dummy pads, and the second power pad is disposed between the second signal pad and the plurality of second dummy pads.

12. The chip-on-film package of claim 11, wherein, in the first direction, the plurality of first dummy pads and the plurality of second dummy pads are arranged between the first power pad and the second power pad.

13. The chip-on-film package of claim 12, wherein the first power pattern is disposed between the first signal pattern and the first dummy pattern, and the second power pattern is disposed between the second signal pattern and the second dummy pattern.

14. The chip-on-film package of claim 1, wherein the plurality of first dummy pads are electrically connected to each other by the first dummy pattern, and the plurality of second dummy pads are electrically connected to each other by the second dummy pattern.

15. A display device comprising:

a display panel on which a plurality of pixels connected to a plurality of gate lines and a plurality of source lines are arranged; and a chip-on-film package including a base film attached to the display panel and a semiconductor chip mounted on the base film, wherein the chip-on-film package includes a plurality of chip pads connected to the semiconductor chip, a plurality of dummy patterns connected to dummy pads among the plurality of chip pads, a plurality of signal patterns connected to signal pads among the plurality of chip pads, and a plurality of test pads connected to the plurality of dummy patterns, and in a first direction at least one of the plurality of dummy patterns is adjacent to one of the plurality of signal patterns and separated therefrom by a first distance, and the first distance is greater than at least one of a second distance between a pair of dummy patterns adjacent to each other while extending in the first direction and a third distance between a pair of signal patterns adjacent to each other while extending in the first direction, wherein the plurality of dummy patterns include a first dummy pattern connected to first dummy pads among the dummy pads and a second dummy pattern connected to second dummy pads among the dummy pads, the chip-on-film package includes a first test pad connected to the first dummy pattern and a second test pad connected to the second dummy pattern, and the first test pad and the second test pad are separated from the display panel.

16. The display device of claim 15, wherein, in the semiconductor chip, first dummy pads, among the dummy pads, are connected to a first signal pad, among the signal pads, and second dummy pads, among the dummy pads, are connected to a second signal pad among the signal pads.

17. The display device of claim 16, wherein the number of first dummy pads is greater than the number of first signal pads.

18. The display device of claim 16, wherein the first test pad and the second test pad are exposed to the outside.

19. A chip-on-film package comprising:

a base film;

a first signal pad formed on the base film and connected to a first source line among a plurality of source lines disposed on a display panel through a first signal pattern;

a second signal pad formed on the base film and connected to a second source line among the plurality of source lines through a second signal pattern;

a first dummy pattern separated from the first signal pattern by a first distance in a first direction, a first end thereof being connected to a first test pad separated from the display panel, and a second end thereof being connected to a first dummy pad; and a second dummy pattern separated from the first dummy pattern by a second distance in the first direction, a first end thereof being connected to a second test pad separated from the display panel, and a second end thereof being connected to a second dummy pads, wherein the first distance is greater than at least one of the second distance and a third distance between a pair of signal patterns adjacent to each other in the first direction.

* * * * *